United States Patent
Han

(10) Patent No.: US 9,719,163 B2
(45) Date of Patent: Aug. 1, 2017

(54) METHOD OF MANUFACTURING DEPOSITION MASK

(71) Applicant: Samsung Display Co., Ltd., Yongin, Gyeonggi-Do (KR)

(72) Inventor: Jeongwon Han, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 200 days.

(21) Appl. No.: 14/795,253

(22) Filed: Jul. 9, 2015

(65) Prior Publication Data

US 2016/0160339 A1    Jun. 9, 2016

(30) Foreign Application Priority Data

Dec. 5, 2014 (KR) .......................... 10-2014-0174272

(51) Int. Cl.

| | | |
|---|---|---|
| *G03F 7/16* | (2006.01) | |
| *G03F 7/32* | (2006.01) | |
| *G03F 7/34* | (2006.01) | |
| *G03F 7/40* | (2006.01) | |
| *C23C 14/04* | (2006.01) | |
| *G03F 7/20* | (2006.01) | |

(52) U.S. Cl.
CPC .............. *C23C 14/042* (2013.01); *G03F 7/16* (2013.01); *G03F 7/164* (2013.01); *G03F 7/2022* (2013.01); *G03F 7/32* (2013.01); *G03F 7/34* (2013.01); *G03F 7/40* (2013.01)

(58) Field of Classification Search
CPC ......... C23C 14/042; G03F 7/16; G03F 7/164; G03F 7/2022; G03F 7/32; G03F 7/34; G03F 7/40
USPC ........................... 430/22, 312, 314, 320, 394
See application file for complete search history.

(56) References Cited

FOREIGN PATENT DOCUMENTS

| | | |
|---|---|---|
| KR | 10-2003-0049964 A | 6/2003 |
| KR | 10-2005-0120170 A | 12/2005 |
| KR | 10-2007-0002553 A | 1/2007 |
| KR | 10-2008-0000449 A | 1/2008 |
| KR | 10-2013-0037482 A | 4/2013 |

*Primary Examiner* — Christopher Young
(74) *Attorney, Agent, or Firm* — Knobbe Martens Olson & Bear LLP

(57) ABSTRACT

A method of manufacturing a deposition mask is disclosed. In one aspect, the method includes depositing a first photoresist layer on a substrate, aligning a first photomask over the first photoresist layer and developing the first photoresist layer to form a plurality of first photoresist patterns having sides that gradually narrow toward the substrate. The method also includes forming a metal layer over the first photoresist patterns and a portion of the substrate exposed by the first photoresist patterns, depositing a second photoresist layer over the metal layer and aligning a second photomask over the second photoresist layer and developing the second photoresist layer to form a plurality of second photoresist patterns between the first photoresist patterns. The method further includes etching the metal layer to form a pattern hole, removing the first and second photoresist patterns and separating the substrate so as to form a deposition mask.

20 Claims, 4 Drawing Sheets

METHOD OF MANUFACTURING DEPOSITION MASK

RELATED APPLICATION

This application claims the benefit of Korean Patent Application No. 10-2014-0174272, filed on Dec. 5, 2014, in the Korean Intellectual Property Office, the disclosure of which is incorporated herein in its entirety by reference.

BACKGROUND

Field

The described technology generally relates to a method of manufacturing a deposition mask.

Description of the Related Technology

An organic light-emitting diode (OLED) display can be driven at a low voltage and has a wide viewing angle and high contrast. OLED technology has favorable characteristics such as a fast response time, light weight, and slim profile. Therefore, an OLED display is considered to be a next-generation display.

Light-emitting devices are classified into inorganic light-emitting devices and organic light-emitting devices according to materials forming an emission layer. Recently, organic light-emitting devices have been actively developed since they have higher luminance and faster response time than inorganic light-emitting devices and may also provide full colors.

SUMMARY OF CERTAIN INVENTIVE ASPECTS

One inventive aspect is a method of manufacturing a deposition mask.

Another aspect is a method of manufacturing a deposition mask that includes: depositing a first photoresist layer on a substrate; aligning a first photomask on the first photoresist layer and exposing and developing the first photoresist layer by photolithography to form a plurality of first photoresist patterns having sides that gradually narrow toward the substrate; forming a metal layer on the plurality of first photoresist patterns and a portion of the substrate exposed by the plurality of first photoresist patterns; depositing a second photoresist layer on the metal layer; aligning a second photomask on the second photoresist layer and exposing and developing the second photoresist layer by photolithography to form a plurality of second photoresist patterns between the plurality of first photoresist patterns; etching the metal layer to form a pattern hole; removing the first photoresist pattern and the second photoresist pattern; and separating the substrate from a mask.

The depositing of the first photoresist layer on the substrate may include: polishing a surface of the substrate on which the first photoresist layer is to be deposited; and depositing the first photoresist layer on the surface of the substrate.

The depositing of the second photoresist layer on the metal layer may include: polishing a surface of the metal layer on which the second photoresist layer is to be deposited; and depositing the second photoresist layer on the surface of the metal layer.

The substrate may include a conductive material.

The metal layer may be formed by electroforming on the plurality of first photoresist patterns and the portion of the substrate exposed by the plurality of first photoresist patterns.

The substrate may include a non-conductive material.

The metal layer may be formed by electroless plating on the plurality of first photoresist patterns and the portion of the substrate exposed by the plurality of first photoresist patterns.

The method may further include cleaning and drying the mask after the separating of the substrate from the mask.

A width of a surface opposite other surface of the first photoresist pattern in contact with the substrate may be smaller than a distance between the second photoresist patterns.

The pattern hole may be formed to gradually narrow toward a surface of the metal layer in contact with the substrate.

Another aspect is a method of manufacturing a deposition mask, the method comprising: depositing a first photoresist layer over a substrate; aligning a first photomask with the first photoresist layer and exposing and developing the first photoresist layer to form a plurality of first photoresist patterns having sides that gradually narrow toward the substrate, wherein a portion of the substrate is exposed by the first photoresist patterns; forming a metal layer over the first photoresist patterns and the exposed portion of the substrate; depositing a second photoresist layer over the metal layer; aligning a second photomask with the second photoresist layer and exposing and developing the second photoresist layer to form a plurality of second photoresist patterns between the first photoresist patterns; etching the metal layer to form a pattern hole; removing the first and second photoresist patterns; and separating the substrate from the etched metal layer so as to form a deposition mask.

In the above method, the depositing of the first photoresist layer comprises: polishing a surface of the substrate on which the first photoresist layer is to be deposited; and depositing the first photoresist layer over the surface of the substrate. In the above method, the depositing of the second photoresist layer comprises: polishing a surface of the metal layer on which the second photoresist layer is to be deposited; and depositing the second photoresist layer over the surface of the metal layer. In the above method, the substrate is formed at least partially of a conductive material. In the above method, the metal layer is formed by electroforming over the first photoresist patterns and the exposed portion of the substrate. In the above method, the substrate is formed at least partially of a non-conductive material. In the above method, the metal layer is formed by electroless plating over the first photoresist patterns and the exposed portion of the substrate.

The above method further comprises cleaning and drying the deposition mask after the separating. In the above method, each of the first photoresist patterns includes a top surface having a first width and a bottom surface having a second width less than the first width, wherein the top surface is farther from the substrate than the bottom surface, and wherein the first and second widths of are less than the distance between the second photoresist patterns. In the above method, the metal layer includes top and bottom surfaces opposing each other, wherein the top surface of the metal layer is farther from the substrate than the bottom surface of the metal layer, and wherein the pattern hole is formed to gradually narrow from the top surface of the metal layer to the bottom surface of the metal layer. In the above method, the metal layer is etched by at least one of dry etching and wet etching.

Another aspect is a method of manufacturing a deposition mask, the method comprising: first forming a plurality of first photoresist patterns over a substrate such that sides of the first photoresist patterns gradually narrow toward the substrate and a portion of the substrate is exposed by the first photoresist patterns; second forming a metal layer over the first photoresist patterns; third forming a plurality of second photoresist patterns between the first photoresist patterns; etching the metal layer to form a pattern hole; and removing the first and second photoresist patterns.

The above method further comprises separating the substrate from the etched metal layer so as to form a deposition mask. In the above method, the first forming comprises: forming a first photomask over the substrate to align with the first photoresist layer; and exposing and developing the first photoresist layer to form the first photoresist patterns. In the above method, the second forming comprises: forming a second photomask over the substrate to align with the first photoresist layer; and exposing and developing the second photoresist layer to form the second photoresist patterns. In the above method, the metal layer is formed by electroforming over the first photoresist patterns and the exposed portion of the substrate. In the above method, the metal layer is formed by electroless plating over the first photoresist patterns and the exposed portion of the substrate.

In the above method, each of the first photoresist patterns includes a top surface having a first width and a bottom surface having a second width less than the first width, wherein the top surface is farther from the substrate than the bottom surface, and wherein the first and second widths are less than the distance between the second photoresist patterns. In the above method, the metal layer includes top and bottom surfaces opposing each other, wherein the top surface of the metal layer is farther from the substrate than the bottom surface of the metal layer, and wherein the pattern hole is formed to gradually narrow from the top surface of the metal layer to the bottom surface of the metal layer. In the above method, the metal layer is etched by at least one of dry etching and wet etching.

DETAILED DESCRIPTION OF CERTAIN INVENTIVE EMBODIMENTS

Figure 1:
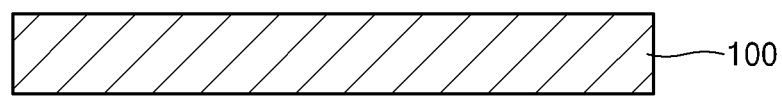
FIGS. 1 to 8 illustrate step-by-step cross-sectional views for explaining a method of manufacturing a deposition mask according to an exemplary embodiment.

Organic layers and/or electrodes of OLED displays are formed by vacuum deposition. As the resolution of an OLED display increases, the width of an open slit of a mask used in a deposition process decreases and the distribution thereof also needs to decrease.

Also, in order to manufacture a high-resolution OLED display, a shadow effect needs to be reduced or prevented from occurring. Accordingly, a deposition process is performed in a state when a substrate and a mask are closely adhered to each other, and the development of a technology for improving the close adhesion between the substrate and the mask is required.

Exemplary embodiments will be described with reference to the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The described technology may include various embodiments and modifications, and exemplary embodiments thereof are illustrated in the drawings and will be described herein in detail. The effects and features of the described technology and the accomplishing methods thereof will become apparent from the following description of exemplary embodiments, taken in conjunction with the accompanying drawings. However, the described technology is not limited to the exemplary embodiments described below, and may be embodied in various modes.

It will be understood that although the terms "first", "second", etc. may be used herein to describe various components, these components should not be limited by these terms. These terms are only used to distinguish one component from another. As used herein, the singular forms "a", "an", and "the" are intended to include the plural forms as well, unless the context clearly indicates otherwise. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Sizes of elements in the drawings may be exaggerated for convenience of description. In other words, since sizes and thicknesses of elements in the drawings are arbitrarily illustrated for convenience of description, the following embodiments are not limited thereto. When a certain embodiment may be implemented differently, a specific process order may be performed differently from the described order. For example, two consecutively described processes may be performed substantially at the same time or performed in an order opposite to the described order.

Hereinafter, exemplary embodiments will be described in detail with reference to the accompanying drawings. In the following description, like reference numerals denote like elements, and redundant descriptions thereof will be omitted.

FIGS. 1 to 8 illustrate step-by-step cross-sectional views for explaining a method of manufacturing a deposition mask according to an exemplary embodiment.

Referring to FIG. 1, in order to manufacture a deposition mask 300' (see FIG. 8), a substrate 100 is prepared. Various structures may be staked on the substrate 100

Figure 2:
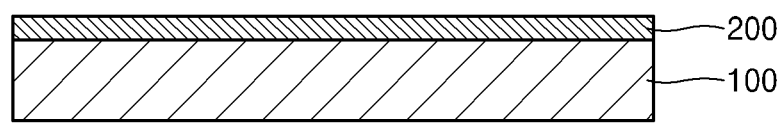

As illustrated in FIG. 2, a first photoresist layer 200 is deposited on the substrate 100. The first photoresist layer 200 may be of a positive type or a negative type. For example, if the photoresist layer is of a positive type, an exposed region of the substrate is etched. On the other hand, if the photoresist layer is of a negative type, a residual region of the substrate other than an exposed region thereof is etched.

The first photoresist layer 200 may be formed by depositing a photoresist (not illustrated) on the substrate 100 by various processes such as spin coating, spraying, and immersing. The first photoresist layer 200 may be formed by a spin coating process that may substantially uniformly deposit a photoresist also on a large-sized substrate.

Before depositing the first photoresist layer 200 on the substrate 100, a surface of the substrate 100 on which the first photoresist layer 200 will be deposited may be polished. Accordingly, since the surface of the substrate 100 is smoothed, the first photoresist layer 200 may be substantially uniformly deposited on the substrate 100, and a surface of a metal layer 300 (see FIG. 4) to be plated on the polished substrate 100 may also be formed smoothly. Thus, the close adhesion between the deposition mask 300' (see FIG. 8) and a display substrate (not illustrated), on which a deposition material is to be deposited, may be improved in a subsequent deposition process.

Figure 3:
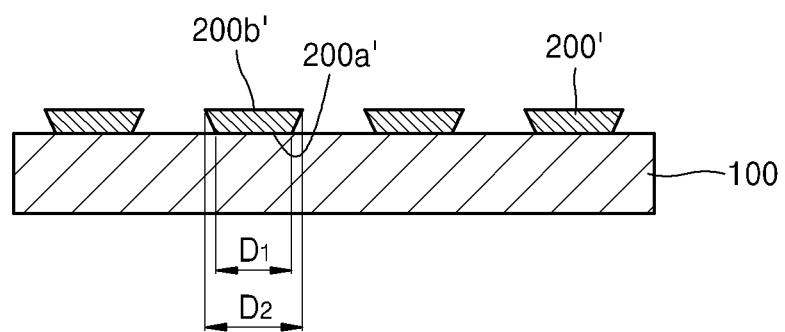

Referring to FIG. 3, after depositing the first photoresist layer 200 on the substrate 100, a photolithography process is performed thereon. Although not illustrated in the drawings, the photolithography process is started by substantially aligning a first photomask (not illustrated), in which a plurality of openings (not illustrated) having a shape corresponding to a first photoresist pattern 200' to be formed are formed, with the first photoresist layer 200.

After substantially aligning the first photomask with the first photoresist layer 200, a portion of the first photoresist layer 200 blocked by the first photomask is exposed to light and then the first photoresist layer 200 is selectively developed to form a plurality of first photoresist patterns 200' on the surface of the substrate 100.

In this case, a side of each of the first photoresist patterns 200' is formed to gradually narrow toward the substrate 100. That is, the width D1 of one surface 200a' of the first photoresist pattern 200' contacting the substrate 100 is less than the width D2 of the other surface 200b' opposite to the one surface 200a'.

In order to taper the side of the first photoresist pattern 200', the angle of a light irradiated on the first photoresist layer 200 in the exposure process may be adjusted to correspond to the angle between the substrate 100 and the side of the first photoresist pattern 200'.

Also, by adjusting the angle of the light irradiated on the first photoresist layer 200 and moving at least one of an oscillator (not illustrated) irradiating light and a worktable (not illustrated) supporting the substrate 100 through a path corresponding to the shape of the first photoresist pattern 200', light may be irradiated along a boundary surface of the side of the first photoresist pattern 200' to be formed.

Figure 4:
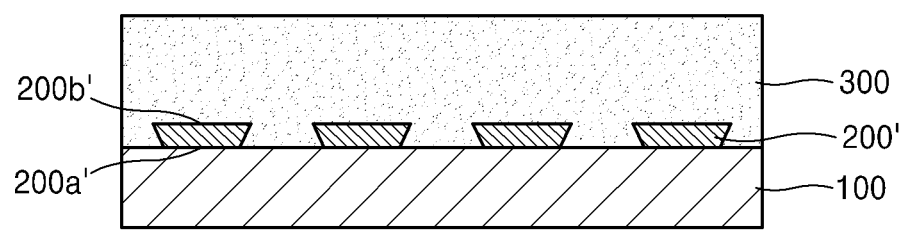

Referring to FIG. 4, after forming the first photoresist patterns 200' on the substrate 100, a metal layer 300 is formed on the first photoresist patterns 200' and a portion of the substrate 100 exposed by the first photoresist patterns 200'.

In this case, the metal layer 300 may be formed by at least one of electroforming and electroless plating. When the substrate 100 is formed of a conductive material, the metal layer 300 may be formed by electroforming. On the other hand, when the substrate 100 is formed of a non-conductive material, the metal layer 300 may be formed by electroless plating.

Figure 5:
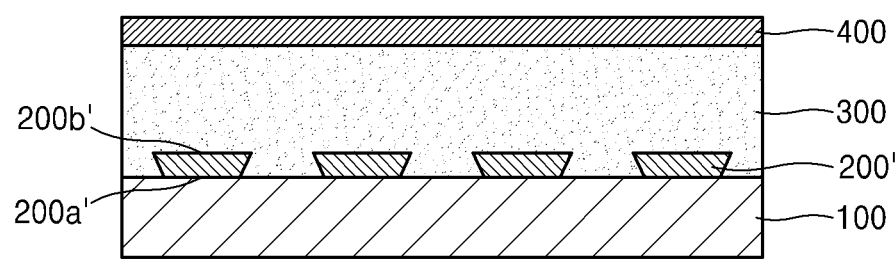

Referring to FIG. 5, after forming the metal layer 300 on the first photoresist patterns 200' and the portion of the substrate 100 exposed by the first photoresist patterns 200', a second photoresist layer 400 is deposited on the metal layer 300.

In this case, before the depositing of the second photoresist layer 400 on the metal layer 300, a surface of the metal layer 300 on which the second photoresist layer 400 will be deposited may be polished. When the polishing process is performed, the surface of the metal layer 300, on which the second photoresist layer 400 will be deposited, is smoothed and thus the second photoresist layer 400 may be uniformly deposited on the metal layer 300.

Since the characteristics and the forming method of the second photoresist layer 400 are substantially the same as the characteristics and the forming method of the first photoresist layer 200, redundant descriptions thereof will be omitted for conciseness.

Figure 6:
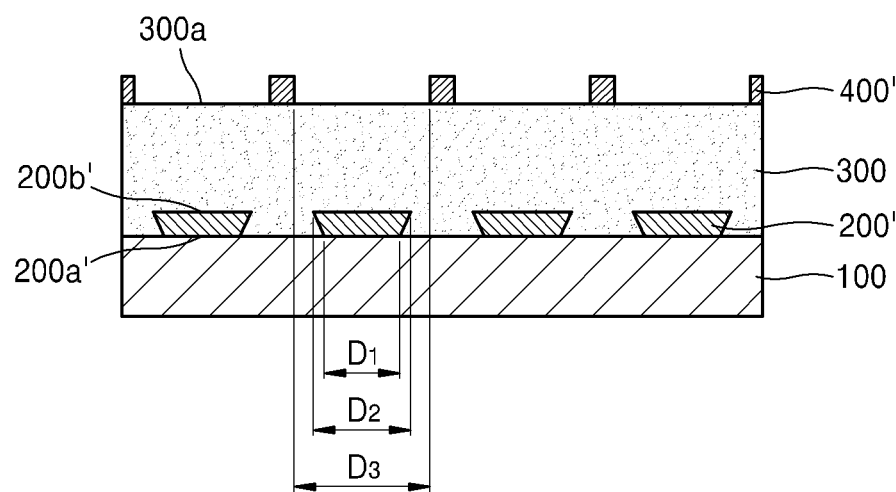

Referring to FIG. 6, after the depositing of the second photoresist layer 400 on the metal layer 300, a photolithography process is again performed thereon. Although not illustrated in the drawings, the photolithography process is started by aligning a second photomask (not illustrated), in which a plurality of second openings (not illustrated) having a shape corresponding to a second photoresist pattern 400' to be formed are formed, on the second photoresist layer 400.

After aligning the second photomask on the second photoresist layer 400, a portion of the second photoresist layer 400 blocked by the second photomask is exposed to light and then the second photoresist layer 400 is selectively developed to form a plurality of second photoresist patterns 400' on the metal layer 300. In this case, each of the second photoresist patterns 400' may be disposed between the respective first photoresist patterns 200'.

For example, the width D2 of the other surface 200b' opposite to the one surface 200a' of the first photoresist pattern 200' disposed to contact the substrate 100 may be less than the distance D3 between the second photoresist patterns 400'. As described above, the width D1 of the one surface 200a' of the first photoresist pattern 200' is smaller than the width D2 of the other surface 200b'. Therefore, the distance D3 between the second photoresist patterns 400', the width D2 of the other surface 200b' of the first photoresist pattern 200', and the width D1 of the one surface 200a' of the first photoresist pattern 200' may be sequentially narrowed.

Figure 7:
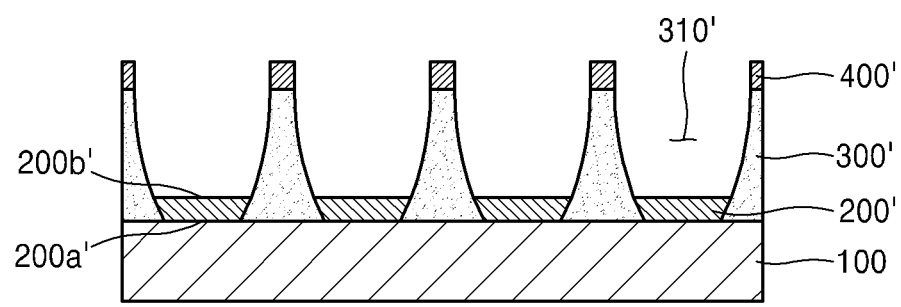

When the first photoresist patterns 200', the metal layer 300, and the second photoresist patterns 400' are formed in this structure, a pattern hole 310' may be formed to gradually narrow toward the substrate 100 as illustrated in FIGS. 6 and 7. Herein, the pattern hole 310' may be formed by forming the second photoresist pattern 400' on the metal layer 300 and then etching the metal layer 300 by at least one of dry etching and wet etching.

For example, the etching of the metal layer 300 is started from one surface 300a of the metal layer 300 that is adjacent to the second photoresist pattern 400'. As described above, the width D3 of the one surface 300a of the metal layer 300 except the region blocked by the second photoresist pattern 400' is larger than the width D1 of the one surface 200a' and the width D2 of the other surface 200b' of the first photoresist pattern 200'.

Thus, when the metal layer 300 is etched, a portion of the one surface 300a of the metal layer 300, which is first exposed, starts to form the pattern hole 310', and the pattern hole 310' is etched toward the other surface 200b' of the first photoresist pattern 200' as the etching process continues. The etched portion may be a portion of the pattern hole 310'.

Figure 8:
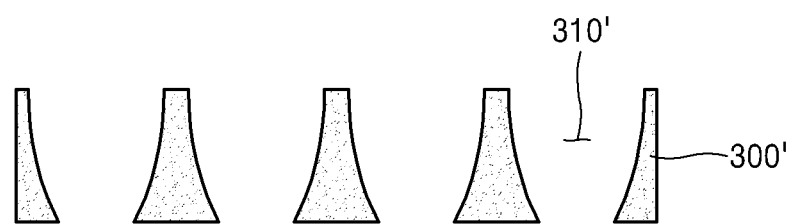

Referring to FIG. 8, after forming the pattern hole 310' by etching the metal layer 300, the deposition mask 300' having the pattern hole 310' formed therein may be obtained by removing the first photoresist patterns 200' and the second photoresist patterns 400' from the substrate 100 and the deposition mask 300' and separating the substrate 100 from the deposition mask 300'.

Herein, one side of the pattern hole 310', on which the first photoresist pattern 200' is disposed, may be tapered according to the shape of the first photoresist pattern 200' having the tapered side. Accordingly, the entire side of the pattern hole 310' may be tapered, and the deposition mask 300' having no projection protruding from the side of the pattern hole 310' may be manufactured.

When the deposition mask 300' having no projection is used in a deposition process, a shadow effect caused by the conventional projection of the pattern hole 310' may be prevented. Thus, the deposition accuracy may be improved, and the display defects may be reduced.

After separating the first photoresist patterns 200', the second photoresist patterns 400', and the substrate 100 from the deposition mask 300', the deposition mask 300' may be cleaned and dried to remove residual materials remaining on the deposition mask 300'.

As described above, according to at least one of the above exemplary embodiments, since the deposition mask having no projection may be manufactured, the shadow effect in the deposition process may be minimized.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A method of manufacturing a deposition mask, the method comprising:
   depositing a first photoresist layer over a substrate;
   aligning a first photomask with the first photoresist layer and exposing and developing the first photoresist layer to form a plurality of first photoresist patterns having sides that gradually narrow toward the substrate, wherein a portion of the substrate is exposed by the first photoresist patterns;
   forming a metal layer over the first photoresist patterns and the exposed portion of the substrate;
   depositing a second photoresist layer over the metal layer;
   aligning a second photomask with the second photoresist layer and exposing and developing the second photoresist layer to form a plurality of second photoresist patterns between the first photoresist patterns;
   etching the metal layer to form a pattern hole;
   removing the first and second photoresist patterns; and
   separating the substrate from the etched metal layer so as to form a deposition mask.

2. The method of claim 1, wherein the depositing of the first photoresist layer comprises:
   polishing a surface of the substrate on which the first photoresist layer is to be deposited; and
   depositing the first photoresist layer over the surface of the substrate.

3. The method of claim 1, wherein the depositing of the second photoresist layer comprises:
   polishing a surface of the metal layer on which the second photoresist layer is to be deposited; and
   depositing the second photoresist layer over the surface of the metal layer.

4. The method of claim 1, wherein the substrate is formed at least partially of a conductive material.

5. The method of claim 4, wherein the metal layer is formed by electroforming over the first photoresist patterns and the exposed portion of the substrate.

6. The method of claim 1, wherein the substrate is formed at least partially of a non-conductive material.

7. The method of claim 6, wherein the metal layer is formed by electroless plating over the first photoresist patterns and the exposed portion of the substrate.

8. The method of claim 1, further comprising cleaning and drying the deposition mask after the separating.

9. The method of claim 1, wherein each of the first photoresist patterns includes a top surface having a first width and a bottom surface having a second width less than the first width, wherein the top surface is farther from the substrate than the bottom surface, and wherein the first and second widths of are less than the distance between the second photoresist patterns.

10. The method of claim 9, wherein the metal layer includes top and bottom surfaces opposing each other, wherein the top surface of the metal layer is farther from the substrate than the bottom surface of the metal layer, and wherein the pattern hole is formed to gradually narrow from the top surface of the metal layer to the bottom surface of the metal layer.

11. The method of claim 1, wherein the metal layer is etched by at least one of dry etching and wet etching.

12. A method of manufacturing a deposition mask, the method comprising:
   first forming a plurality of first photoresist patterns over a substrate such that sides of the first photoresist patterns gradually narrow toward the substrate and a portion of the substrate is exposed by the first photoresist patterns;
   second forming a metal layer over the first photoresist patterns;
   third forming a plurality of second photoresist patterns between the first photoresist patterns;
   etching the metal layer to form a pattern hole; and
   removing the first and second photoresist patterns.

13. The method of claim 12, further comprising separating the substrate from the etched metal layer so as to form a deposition mask.

14. The method of claim 12, wherein the first forming comprises:
   forming a first photomask over the substrate to align with the first photoresist layer; and
   exposing and developing the first photoresist layer to form the first photoresist patterns.

15. The method of claim 12, wherein the second forming comprises:
   forming a second photomask over the substrate to align with the first photoresist layer; and
   exposing and developing the second photoresist layer to form the second photoresist patterns.

16. The method of claim 12, wherein the metal layer is formed by electroforming over the first photoresist patterns and the exposed portion of the substrate.

17. The method of claim 12, wherein the metal layer is formed by electroless plating over the first photoresist patterns and the exposed portion of the substrate.

18. The method of claim 12, wherein each of the first photoresist patterns includes a top surface having a first width and a bottom surface having a second width less than the first width, wherein the top surface is farther from the substrate than the bottom surface, and wherein the first and second widths are less than the distance between the second photoresist patterns.

19. The method of claim 18, wherein the metal layer includes top and bottom surfaces opposing each other, wherein the top surface of the metal layer is farther from the substrate than the bottom surface of the metal layer, and wherein the pattern hole is formed to gradually narrow from the top surface of the metal layer to the bottom surface of the metal layer.

20. The method of claim 12, wherein the metal layer is etched by at least one of dry etching and wet etching.

\* \* \* \* \*